United States Patent
Tsutsumi et al.

(10) Patent No.: US 6,597,261 B2
(45) Date of Patent: Jul. 22, 2003

(54) SURFACE ACOUSTIC WAVE LADDER FILTER USING INTERDIGITAL TRANSDUCERS NOT INVOLVING RESONANCE

(75) Inventors: Jun Tsutsumi, Kawasaki (JP); Shogo Inoue, Kawasaki (JP); Takashi Matsuda, Kawasaki (JP); Osamu Ikata, Kawasaki (JP)

(73) Assignees: Fujitsu Limited, Kawasaki (JP); Fujitsu Media Devices Limited, Suzaki (JP)

( * ) Notice: Subject to any disclaimer, the term of this patent is extended or adjusted under 35 U.S.C. 154(b) by 57 days.

(21) Appl. No.: 09/819,764

(22) Filed: Mar. 29, 2001

(65) Prior Publication Data

US 2002/0057142 A1 May 16, 2002

(30) Foreign Application Priority Data

Nov. 15, 2000 (JP) ........................ 2000-348423

(51) Int. Cl.[7] ................................. H03H 9/64
(52) U.S. Cl. .................... 333/193; 333/195; 310/313 D; 310/313 B
(58) Field of Search ................. 333/193–196; 310/313 R, 313 B, 313 C, 313 D

(56) References Cited

U.S. PATENT DOCUMENTS

| | | | | |
|---|---|---|---|---|
| 3,727,155 A | | 4/1973 | De Vries | 333/194 |
| 4,742,319 A | * | 5/1988 | Sone | 310/313 A |
| 4,902,925 A | | 2/1990 | Wright | 310/313 B |
| 5,610,566 A | * | 3/1997 | Chen et al. | 310/313 D |
| 5,729,186 A | | 3/1998 | Seki et al. | 333/194 |
| 6,297,713 B1 | * | 10/2001 | Kadota et al. | 310/313 B |

FOREIGN PATENT DOCUMENTS

| | | | | |
|---|---|---|---|---|
| JP | 05083084 A | * | 4/1993 | H03H/9/64 |
| JP | 11-340783 | | 12/1999 | |

* cited by examiner

*Primary Examiner*—Barbara Summons
(74) *Attorney, Agent, or Firm*—Armstrong, Westerman & Hattori, LLP

(57) ABSTRACT

A surface acoustic wave filter has, on a piezoelectric substrate, surface acoustic wave resonators each composed of an interdigital transducer and reflectors disposed on both sides of the interdigital transducer. The surface acoustic wave resonators are arranged in series arms and in parallel arms to be connected in a ladder form. At least one of the surface acoustic wave resonators is replaced with an interdigital transducer that does not involve resonance in a propagation direction of a surface acoustic wave.

6 Claims, 19 Drawing Sheets

FIG. 11

| ITEMS | SERIES RESONATOR (SPLIT ELECTRODES) | PARALLEL RESONATOR P (SINGLE ELECTRODE) | PARALLEL RESONATOR P' (SINGLE ELECTRODE) |
|---|---|---|---|
| ELECTRODE PERIOD OF IDT | 4.88 μm | 4.88 μm | 4.88 μm |
| APERTURE LENGTH OF IDT | 50 μm | 100 μm | 150 μm |
| NUMBER OF PAIRS IN IDT | 169 | 65 | 87 |
| NUMBER OF ELECTRODES IN REFLECTOR | 0 | 120 | 120 |

FIG. 12 (Prior Art)

| ITEMS | SERIES RESONATOR (SINGLE ELECTRODE) | PARALLEL RESONATOR P (SINGLE ELECTRODE) | PARALLEL RESONATOR P' (SINGLE ELECTRODE) |
|---|---|---|---|
| ELECTRODE PERIOD OF IDT | 4.88 μm | 4.88 μm | 4.88 μm |
| APERTURE LENGTH OF IDT | 50 μm | 100 μm | 150 μm |
| NUMBER OF PAIRS IN IDT | 169 | 65 | 87 |
| NUMBER OF ELECTRODES IN REFLECTOR | 120 | 120 | 120 |

FIG. 15

| ITEMS | SERIES RESONATOR S (SPLIT ELECTRODES) | PARALLEL RESONATOR P (SPLIT ELECTRODES) |
|---|---|---|
| ELECTRODE PERIOD OF IDT | 4.66 μm | 4.90 μm |
| APERTURE LENGTH OF IDT | 50 μm | 50 μm |
| NUMBER OF PAIRS IN IDT | 164 | 132 |
| NUMBER OF ELECTRODES IN REFLECTOR | 0 | 0 |

FIG. 16 (Prior Art)

| ITEMS | SERIES RESONATOR S (SINGLE ELECTRODES) | PARALLEL RESONATOR P (SINGLE ELECTRODES) |
|---|---|---|
| ELECTRODE PERIOD OF IDT | 4.6 μm | 4.8 μm |
| APERTURE LENGTH OF IDT | 100 μm | 120 μm |
| NUMBER OF PAIRS IN IDT | 116 | 78 |
| NUMBER OF ELECTRODES IN REFLECTOR | 160 | 120 |

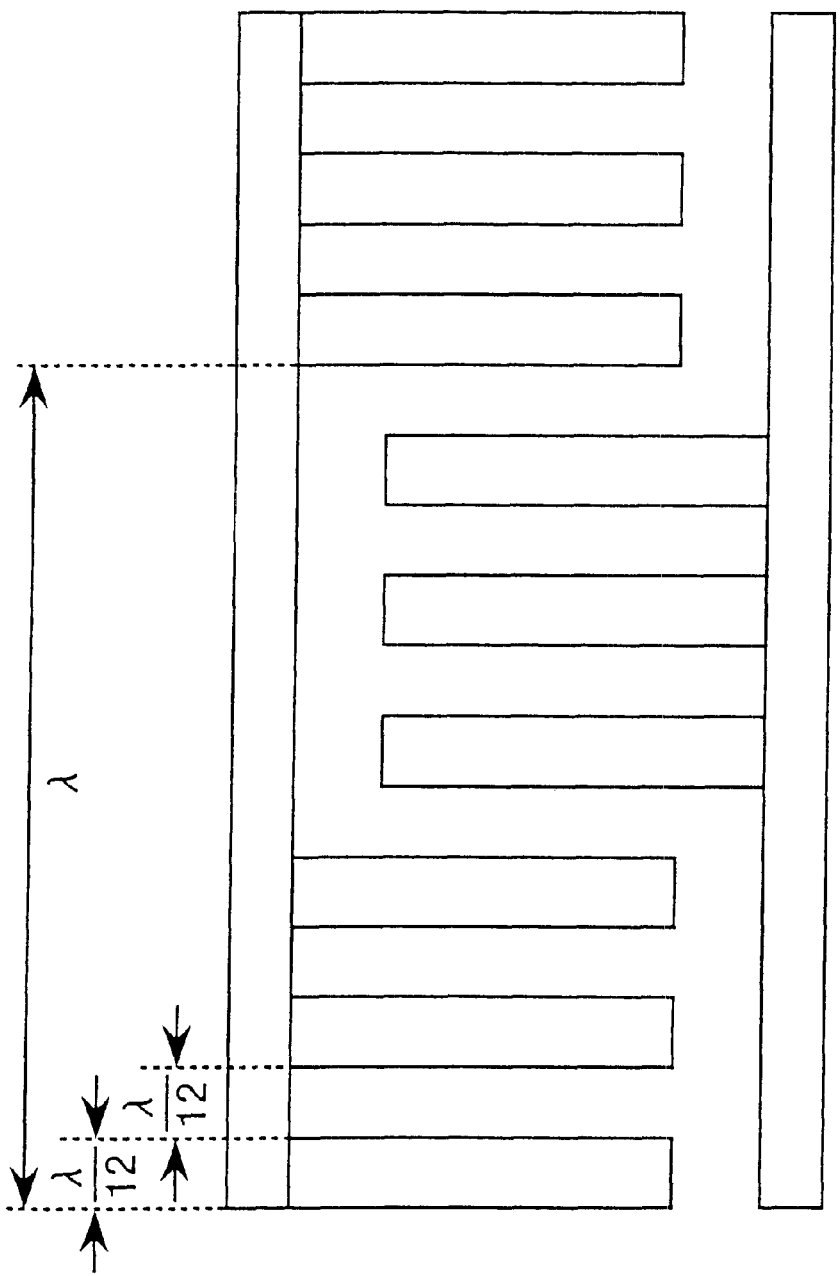

SURFACE ACOUSTIC WAVE LADDER FILTER USING INTERDIGITAL TRANSDUCERS NOT INVOLVING RESONANCE

CROSS-REFERENCE TO RELATED APPLICATION

This application is related to Japanese Patent Application No. 2000-348423 filed on Nov. 15, 2000, whose priority is claimed under 35 USC §119, the disclosure of which is incorporated by reference in its entirety.

BACKGROUND OF THE INVENTION

1. Field of the Invention

The present invention relates to a surface acoustic wave filter, particularly a surface acoustic wave filter in a ladder form in which a plurality of surface acoustic wave resonators are placed in series arms and parallel arms.

2. Description of Related Art

Ladder-form surface acoustic wave (referred to as SAW hereinafter) filters are generally used as SAW filters for portable telephones. In the ladder form SAW filter, a plurality of SAW resonators each composed of an interdigital transducer (referred to as IDT hereinafter) and reflectors disposed on both sides of the IDT are connected in the ladder form on a piezoelectric substrate.

FIG. 18 shows the construction of a basic ladder-form SAW filter currently used. This SAW filter is so constructed that a plurality of SAW resonators are connected in series (S1, S2) and in parallel (P1, P2). FIG. 19 shows a graph of general frequency characteristics required for SAW filters. In FIG. 19, BW1 and BW2 represent band widths at attenuation amounts defined by specifications. For example, BW1 represents a band width at an attenuation amount of −3 dB and BW2 represents a band width at an attenuation amount of −20 dB.

Here, the ratio of BW2 to BW1, i.e., BW2/BW1, is called a shape factor and is a criterion indicating the performance of the filter. A smaller shape factor, that is, a shape factor closer to 1, is better. With recent development in mobile communication systems, filters with a better shape factor are demanded.

However, the shape factor obtained with the basic ladder-form SAW filter shown in FIG. 18 is substantially determined by an electromechanical coupling coefficient of a material for a substrate used. Therefore, it is difficult to improve the shape factor simply by arranging SAW resonators in series and in parallel as shown in FIG. 18.

Accordingly, there is a problem in providing filters having such an excellent shape factor as demanded now with regard to ladder-form SAW filters using SAW resonators as shown in FIG. 18.

SUMMARY OF THE INVENTION

The present invention has been made in view of the above-mentioned circumstances, and an object of the present invention is to improve the shape factor of SAW filters and provide SAW filters having an improved shape factor.

The present invention provides a SAW filter comprising SAW resonators each composed of an IDT and reflectors disposed on both sides of the IDT, the SAW resonators being arranged in series arms and in parallel arms to be connected in a ladder form on a piezoelectric substrate, wherein at least one of the SAW resonators is replaced with an IDT that does not involve resonance in a propagation direction of a surface acoustic wave.

With this construction, the shape factor of the SAW filter can be improved, and also the SAW filter can be reduced in size.

Here, the IDT that does not involve the resonance may be formed of split electrodes.

Also, the IDT that does not involve the resonance may be connected only to a series arm of a ladder-form structure or only to a parallel arm of the ladder-form structure. Further, a plurality of IDTs that do not involve the resonance may be disposed in one or more of the series arms and in one or more of the parallel arms.

The present invention also provides a SAW filter comprising a piezoelectric substrate; and a plurality of SAW resonators and at least one IDT that does not involve resonance, the SAW resonators and the IDT being formed on the piezoelectric substrate and connected in a ladder form, wherein the SAW resonators are each composed of an IDT and reflectors disposed on both sides of the IDT in a direction parallel to a propagation direction of a surface acoustic wave, and the IDT that does not involve the resonance is formed of split electrodes.

In the viewpoint of size reduction, the split electrode may preferably be formed of comb-form electrodes including pairs of two adjacent electrode fingers which are alternately arranged in a direction parallel to the propagation direction of the surface acoustic wave These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 11 is a table of design parameters of an example of an IDT formed of split electrodes in accordance with Example 1 of the present invention;

FIG. 12 is a table explaining parameters of a conventional SAW resonator;

FIG. 15 is a table of design parameters of an example of an IDT formed of split electrodes in accordance with Example 2 of the present invention;

FIG. 16 is a table of design parameters of a conventional SAW resonator;

FIG. 17 illustrates the construction of an example of split electrodes used in the present invention;

DESCRIPTION OF THE PREFERRED EMBODIMENTS

Figure 1:
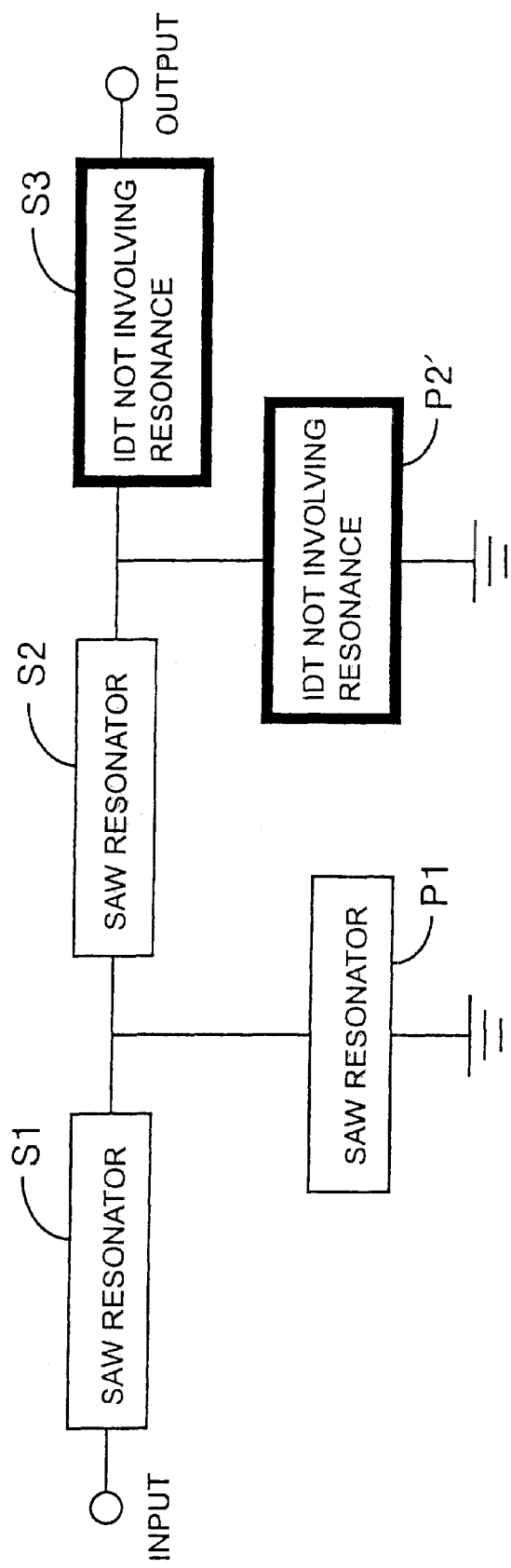
FIG. 1 is a diagram illustrating a basic construction of an example of a ladder-form SAW filter in accordance with the present invention.

The present invention is now described in detail with reference to examples as shown in the drawings. However, the present invention is not limited by these examples.

FIG. 1 is a diagram illustrating a basic construction of an example of a ladder-form SAW filter in accordance with the present invention. This ladder-form SAW filter is characterized by being constructed of a plurality of SAW resonators and at least one IDT that does not involve resonance. In other words, at least one of SAW resonators S1, S2, S3, P1 and P2 of a conventional ladder-form SAW filter is replaced with the IDT that does not involve resonance.

Typically, the SAW resonator is composed of an IDT at the center and reflectors disposed on both sides of the IDT in a direction parallel to the propagation direction of a surface acoustic wave excited by the IDT. That is, the SAW resonator has the construction of "reflector-IDT-reflector." This structure may be produced by forming a thin film of a metal such as Al, Cu or the like into a desired shape on a piezoelectric substrate of LiTaO$_3$, quartz or the like.

The IDT that does not involve resonance may be formed of so-called split electrodes, for example, and the detailed construction thereof will be described later.

In the conventional ladder-form SAW filter, SAW resonators are also used at positions P2' and S3 in FIG. 1, while in the ladder-form SAW filter of the present invention shown in FIG. 1, IDTs that do not involve resonance are used at positions P2' and S3. However, the positions of the IDTs that do not involve resonance are not particularly limited to positions P2' and S3 in FIG. 1, but may be optional.

In addition, the number of the IDTs that do not involve resonance is not limited to two as shown in FIG. 1, but may be at least one. For example, from the viewpoint of improvement of the shape factor, all SAW resonators used in the conventional filter may be replaced with IDTs that do not involve resonance. With this construction, the shape factor of the SAW filter can be improved. Besides, since the IDT that does not involve resonance does not have reflectors, the size of the SAW filter can be reduced as compared with the conventional SAW filter.

Figure 2:
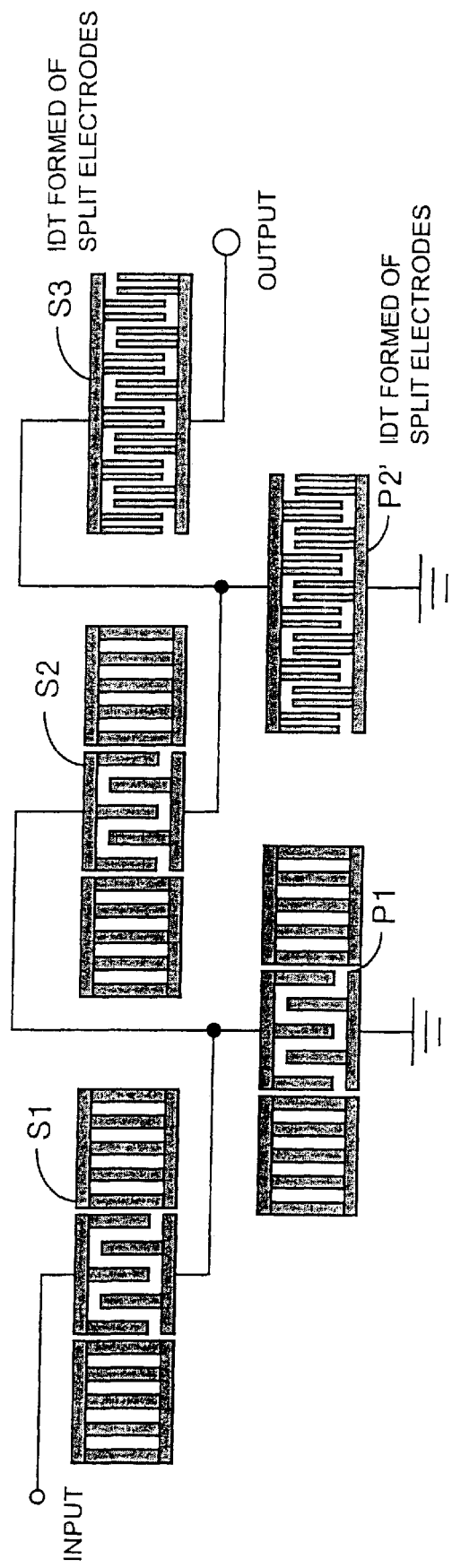
FIG. 2 illustrates the construction of an example of a ladder-form SAW filter in accordance with the present invention, in which IDTs formed of split electrodes are used.

FIG. 2 illustrates the construction of an example of a SAW filter in accordance in with the present invention, in which IDTs formed of split electrodes are disposed as IDTs (S3 and P2) that do not involve resonance.

Figure 3:
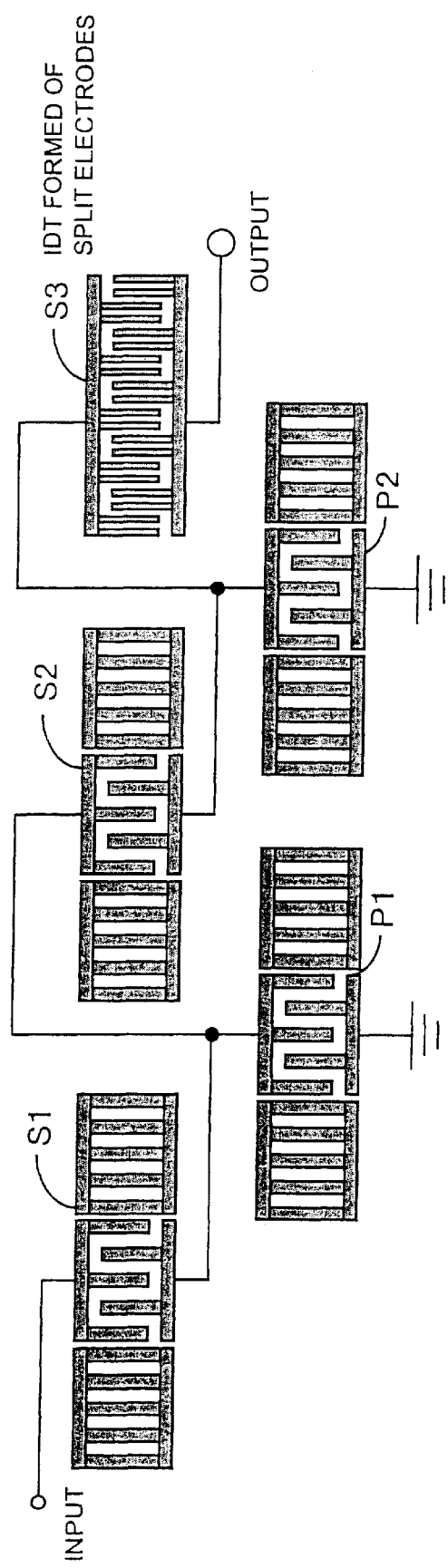
FIG. 3 illustrates the construction of an example of a ladder-form SAW filter in accordance with the present invention, in which the split electrodes are connected only to a series arm.

FIG. 3 illustrates the construction of an example of a ladder-form SAW filter in accordance with the present invention in which an IDT (S3) which is formed of a split electrode and does not involve resonance is connected only to a series arm of the ladder-form SAW filter.

The IDTs formed of split electrodes may be placed in all series arms of the ladder-form SAW filter. They may also be placed only in a part of the parallel arms of the SAW filter or may be used in all the parallel arms.

Figure 18:
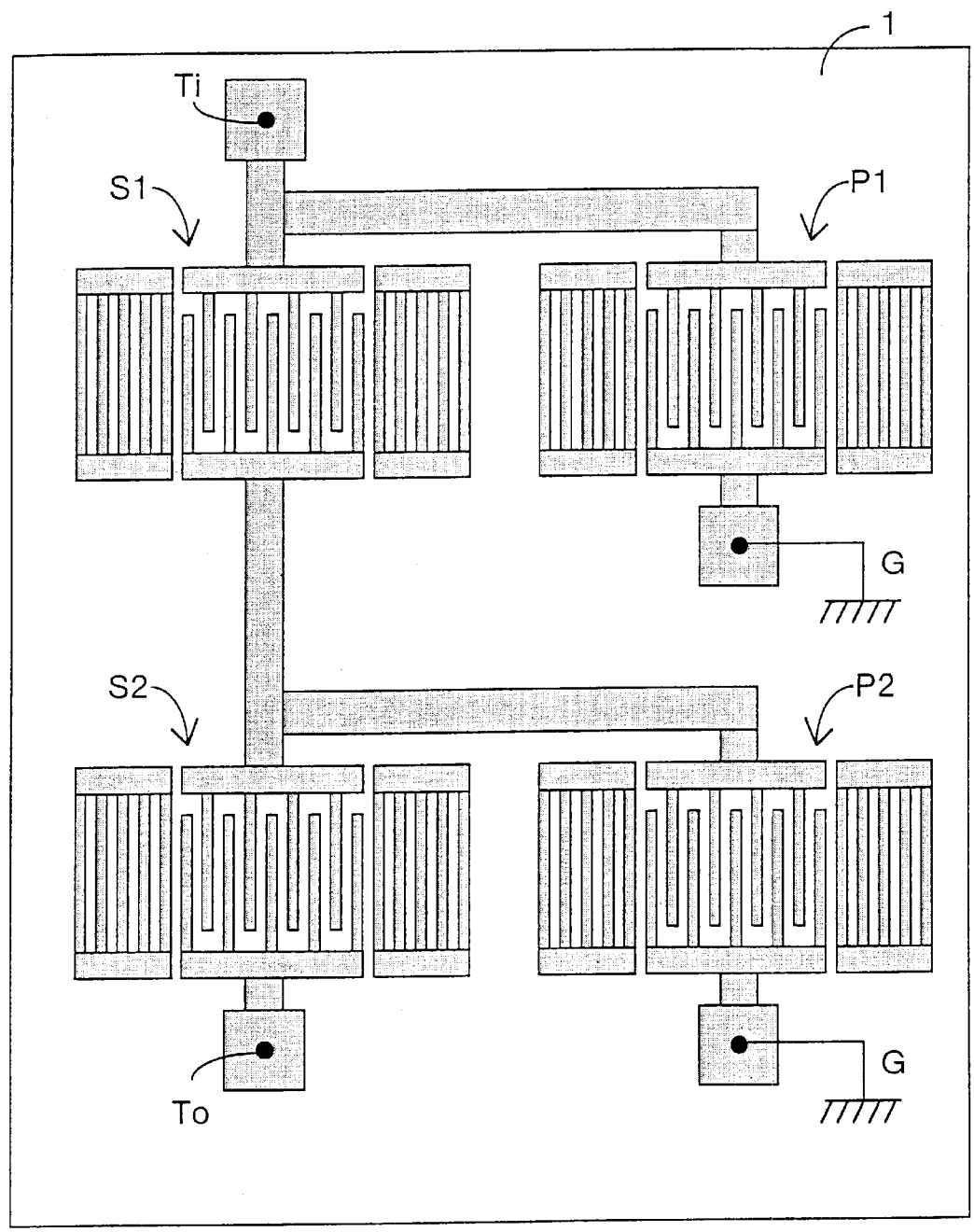
FIG. 18 illustrates the construction of a conventional ladder-form SAW filter.
Figure 19:
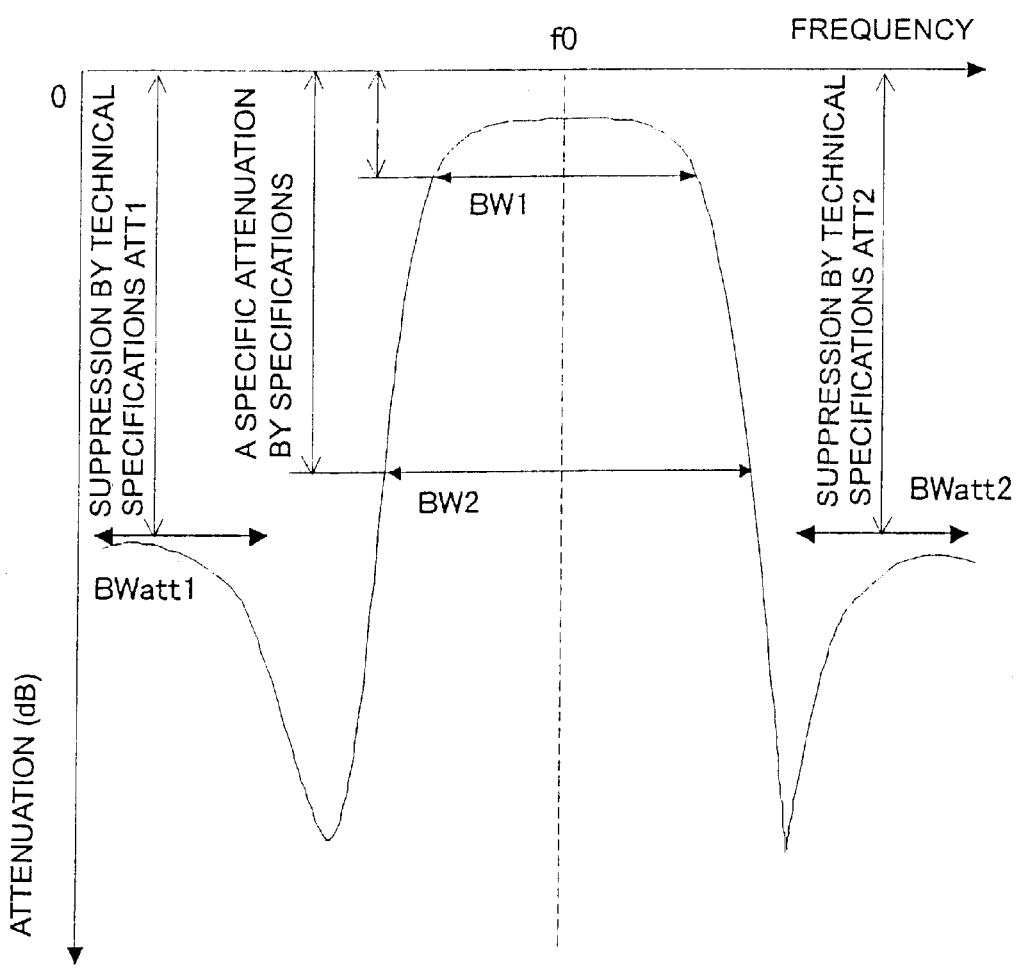
FIG. 19 is a graphical representation of general frequency characteristics required for SAW filters so far.
Figure 20:
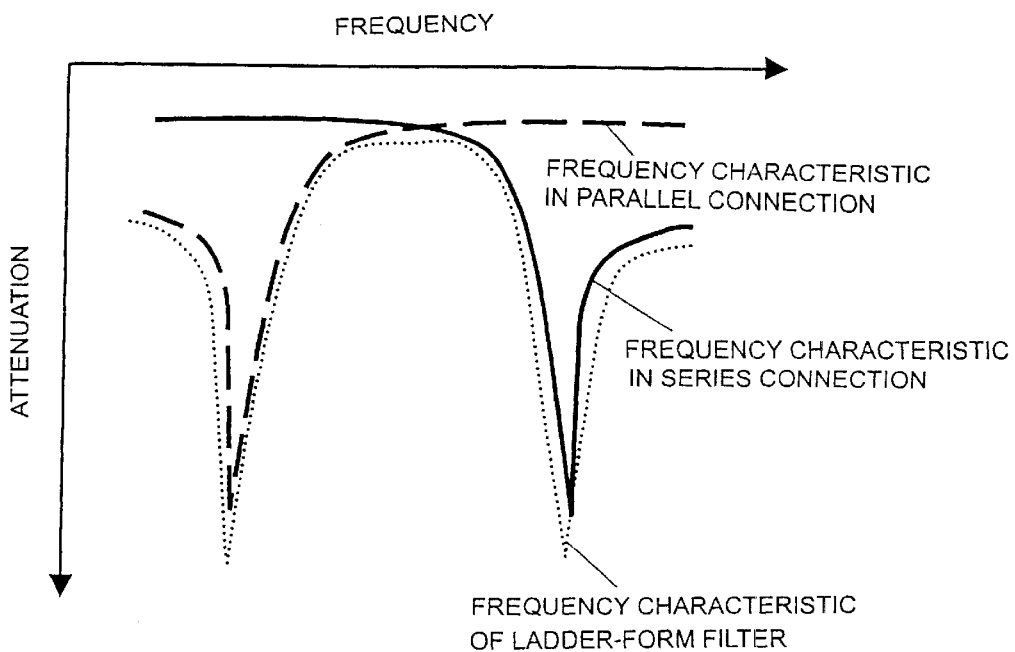
FIG. 20 is a graphical representation of the frequency characteristics of conventional SAW resonators connected in series and in parallel and a ladder-form SAW filter.

Next, explanation is given of general frequency characteristics of the ladder-form SAW filter. As shown in FIG. 18, the ladder-form SAW filter generally has a construction in which a plurality of SAW resonators are connected in series and in parallel. Accordingly, its frequency characteristics are a composition of the frequency characteristics of the SAW resonators S1 and S2 connected in series and those of the SAW resonators P1 and P2 connected in parallel. FIG. 20 shows the frequency characteristics of the conventional SAW resonators connected in series and in parallel.

In FIG. 20, a dotted line represents a frequency characteristic curve of the ladder-form SAW filter.

A broken line in FIG. 20 represents a frequency characteristic curve of SAW resonators connected in parallel. At a relatively low frequency, an attenuation amount increases once, resulting in a drop in the curve. Then the attenuation amount reduces, resulting in a sharp rise of the curve.

A solid line in FIG. 20 represents a frequency characteristic curve of SAW resonators connected in series. The curve is flat at relatively low frequencies, but the attenuation amount increases at a relatively high frequency, resulting in a sharp drop in the curve.

Here, a pass band is formed between the drop in the frequency characteristic curve of the SAW resonators (P1, P2) connected in parallel and the drop in the frequency characteristic curve of the SAW resonators (S1, S2) connected in series. From this principle, it is understood that the shape factor of the frequency characteristics of the ladder-form SAW filter can be improved by sharpening inclinations at the drops concerning the SAW resonators connected in series and in parallel.

Next, explanation is given of an IDT formed of split electrodes.

Figure 4:
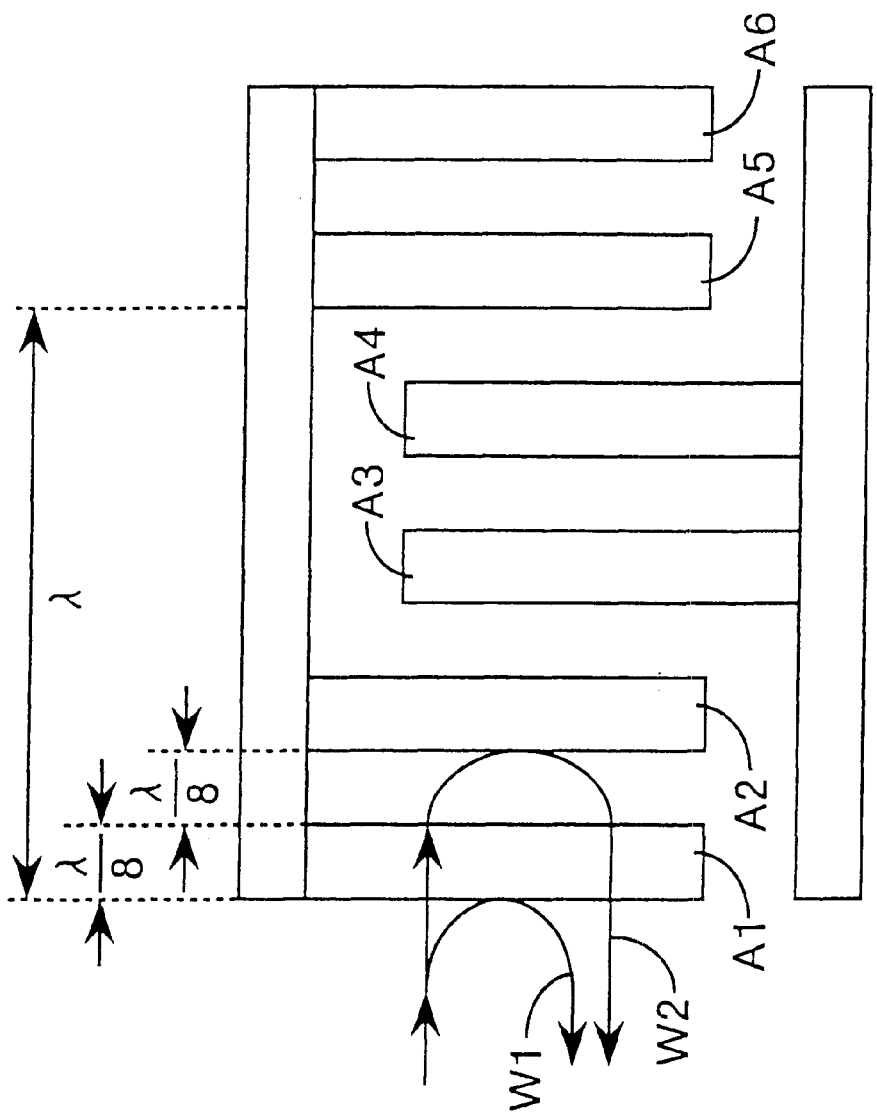
FIG. 4 illustrates the construction of an example of split electrodes used in the present invention.

FIG. 4 shows the construction of an example of split electrodes used in the present invention. Here, two adjacent electrode fingers form a pair of electrode fingers (e.g., A1 and A2, A3 and A4 in FIG. 4) and pairs of electrode fingers are arranged alternately from above and from below in the figure. That is, there is shown a case of comb-form electrodes in which two electrode fingers form a pair of electrode fingers.

The width of each electrode finger (A1 to A6) and the intervals of the electrode fingers are both set to $\lambda/8$ ($\lambda$: period of the IDT). Here, surface acoustic waves W1 and W2 reflected by electrode fingers A1 and A2 are different by $\lambda/2$ in propagation distance and cancel each other. As a result, in the IDT formed of the split electrodes, the reflection of surface acoustic waves does not exist. Therefore, unless reflectors are placed on both side of the IDT, the resonance in the SAW propagation direction is not generated.

Figure 5:
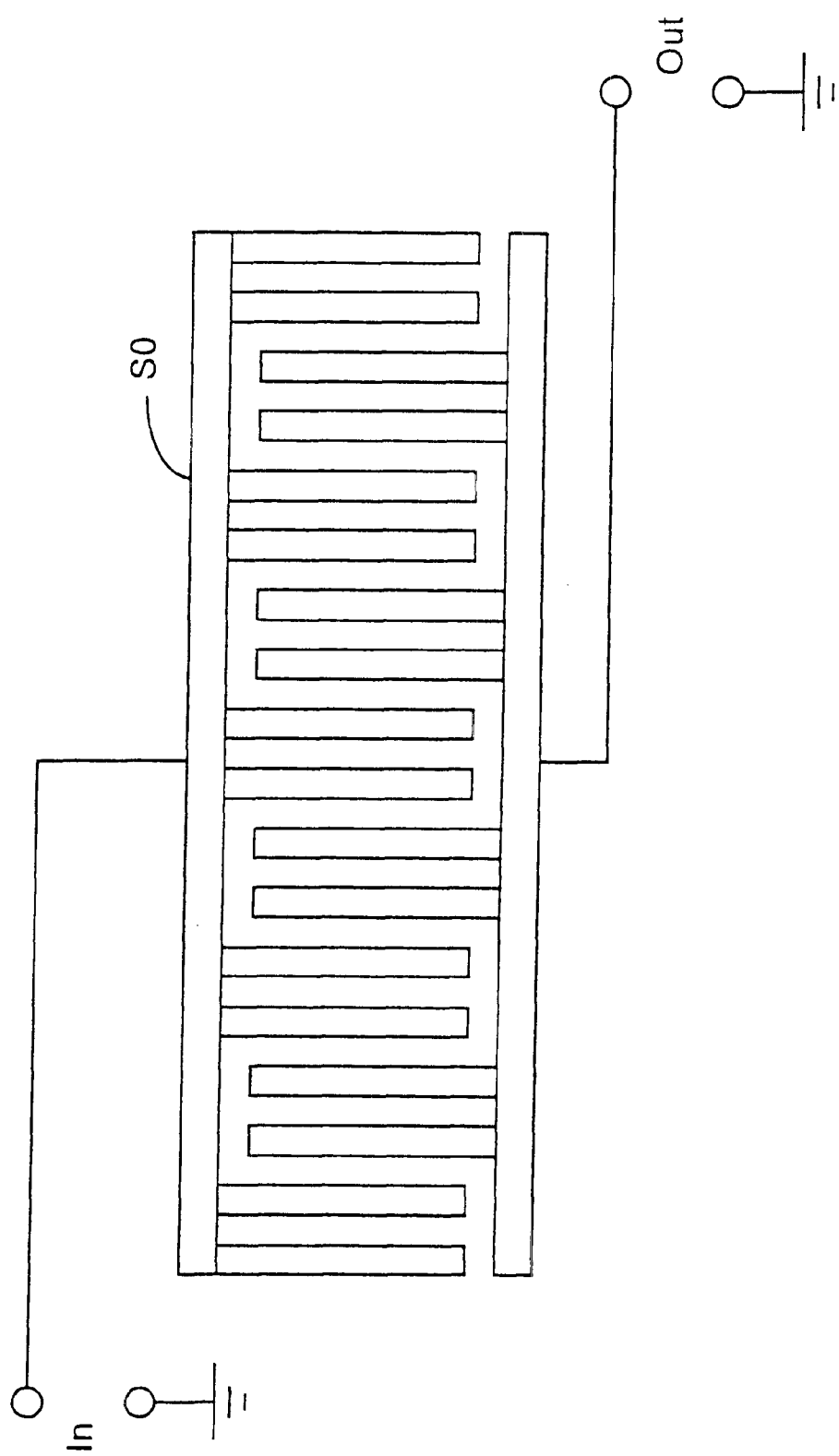
FIG. 5 illustrates the construction of split electrodes connected in series in the present invention.
Figure 6:
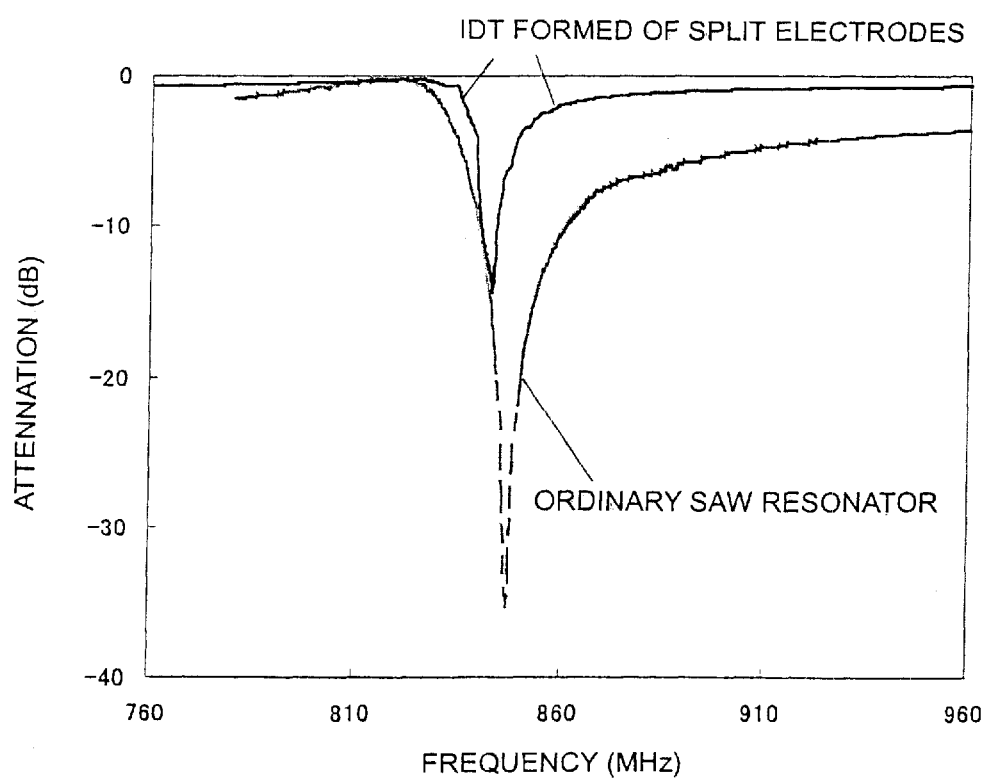
FIG. 6 is a graphical representation of frequency characteristics of split electrodes connected in series.

FIG. 6 shows results of calculation of frequency characteristics of this IDT (SO) formed of the split electrodes which is connected in series as shown in FIG. 5. The substrate of the IDT is of 42° Y-X:LiTaO$_3$, the electrodes are formed of aluminum of 0.34 μm thickness, the period of the IDT is 4.88 μm, an aperture length is 50 μm, and the number of electrode finger pairs is 169.

For comparison, there is also shown the frequency characteristics of an ordinary SAW resonator S1 having reflectors as shown in FIG. 18 which is connected in series as shown in FIG. 5. In FIG. 6, however, the frequency characteristic curve of the ordinary SAW resonator is shifted to a high-frequency side by 20 MHz for easy comparison.

It is understood that the IDT (S0) formed of the split electrodes which does not generate the resonance as shown in FIG. 5 has a sharper inclination at the drop, that is, a sharp increase in the attenuation amount. Consequently, it is understood that the shape factor of the ladder-form SAW filter can be improved by replacing SAW resonators thereof with IDTs that do not involve the resonance in the SAW propagation direction.

As a specific example of the IDT, the IDT formed of the split electrodes shown in FIG. 4 can be used so that the shape factor of the ladder-form filter is improved.

Figure 7:
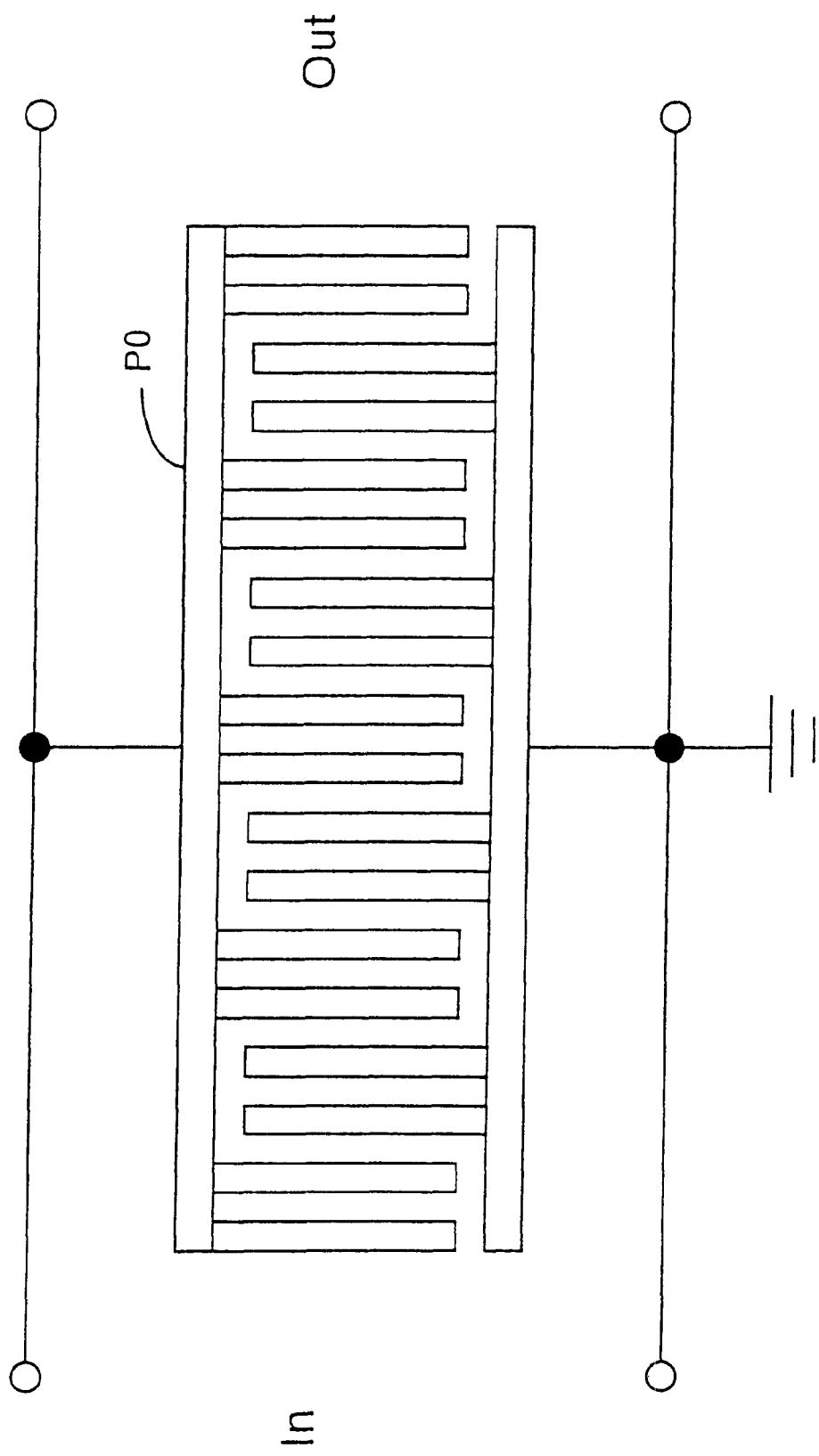
FIG. 7 illustrates the construction of split electrodes connected in parallel in the present invention.
Figure 8:
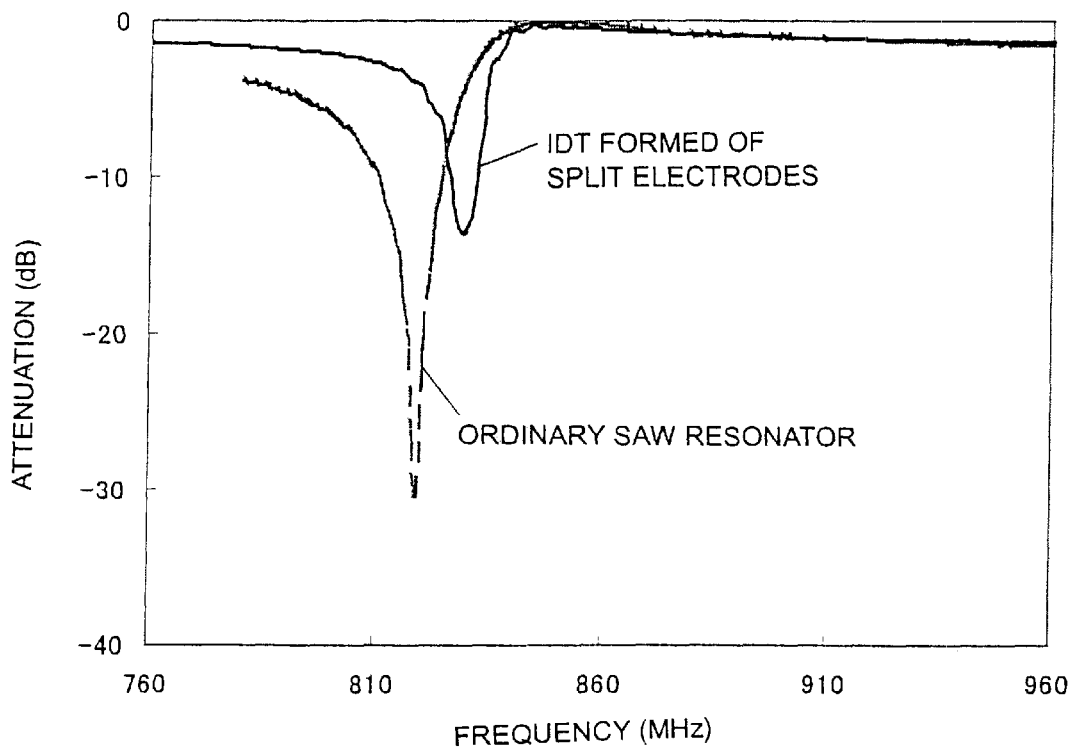
FIG. 8 is a graphical representation of the frequency characteristics of split electrodes connected in parallel.

Next, FIG. 8 shows the frequency characteristics of an IDT(P0) formed of split electrodes which is connected in parallel as shown in FIG. 7. Design conditions of the split electrodes are the same as those of FIG. 5. It is also understood that the IDT (P0) formed of the split electrodes has a sharper inclination at the drop. As a result, it is understood that the use of IDTs that do not involve the resonance in parallel arms sharpens the inclination at the drop and enables the construction of filters with good shape factor.

Figure 21:
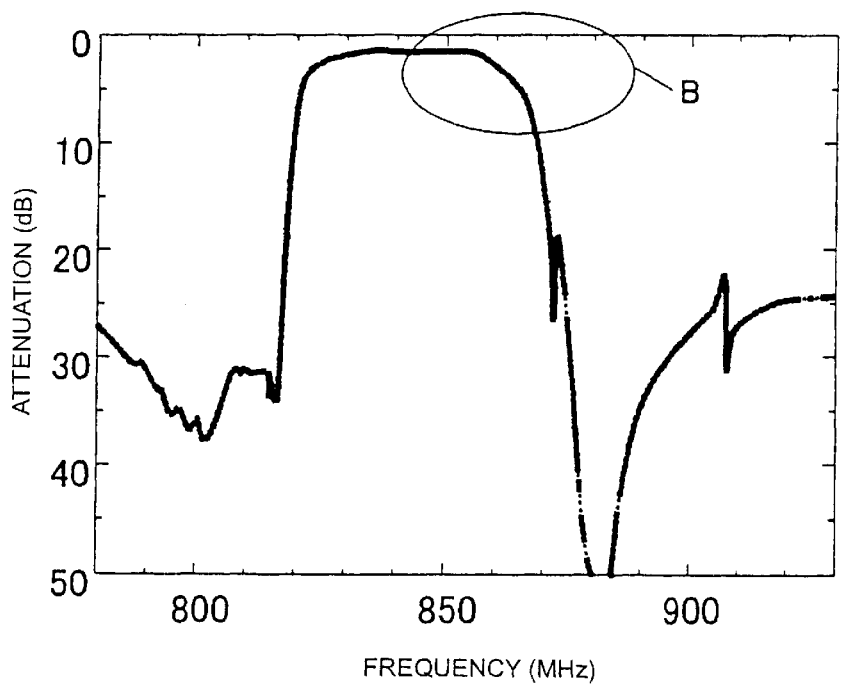
FIG. 21 is a graphical representation of the frequency characteristics of a conventional ladder-form SAW filter.

Generally, in the ladder-form SAW filter, the inclination at the drop on the high-frequency side tends to be gentler than calculated. FIG. 21 shows the frequency characteristics of the conventional ladder-form SAW filter.

The inclination is gentle on the high-frequency side as observed in a region B of FIG. 21. This means that, of the SAW resonators of the ladder-form SAW filter, those connected in series are poor in sharpness at the drop. Accordingly, the shape factor of the filter can be improved more efficiently by replacing SAW resonators (S1, S2, etc.) connected in series with IDTs formed of split electrodes.

FIG. 17 shows the construction of another example of split electrodes used in the present invention. Here, electrode fingers are arranged alternately three by three in upward and downward directions. That is, this shows an IDT in which three electrode fingers form one group of electrode fingers. In this case, the width of each electrode finger and the intervals between the electrode fingers may both be set to λ/12 for producing an IDT that does not involve the resonance. Examples have been shown in which two or three electrode fingers form one group in an alternate arrangement of the split electrodes. However, the number of electrode fingers in one group is not limited thereto but may be four or more.

Further, in the present invention, since only IDTs are used in place of SAW resonators, a space occupied by reflectors is unnecessary, and consequently, the size of a SAW filter device can be reduced.

The drops in the frequency characteristic curve of the IDT formed of the split electrodes exist at higher frequencies than those of the conventional SAW resonator. Therefore, the period of the IDT, i.e., the width and intervals of the electrode fingers, can be increased, and as a result, the productivity rises.

EXAMPLE 1

Figure 9:
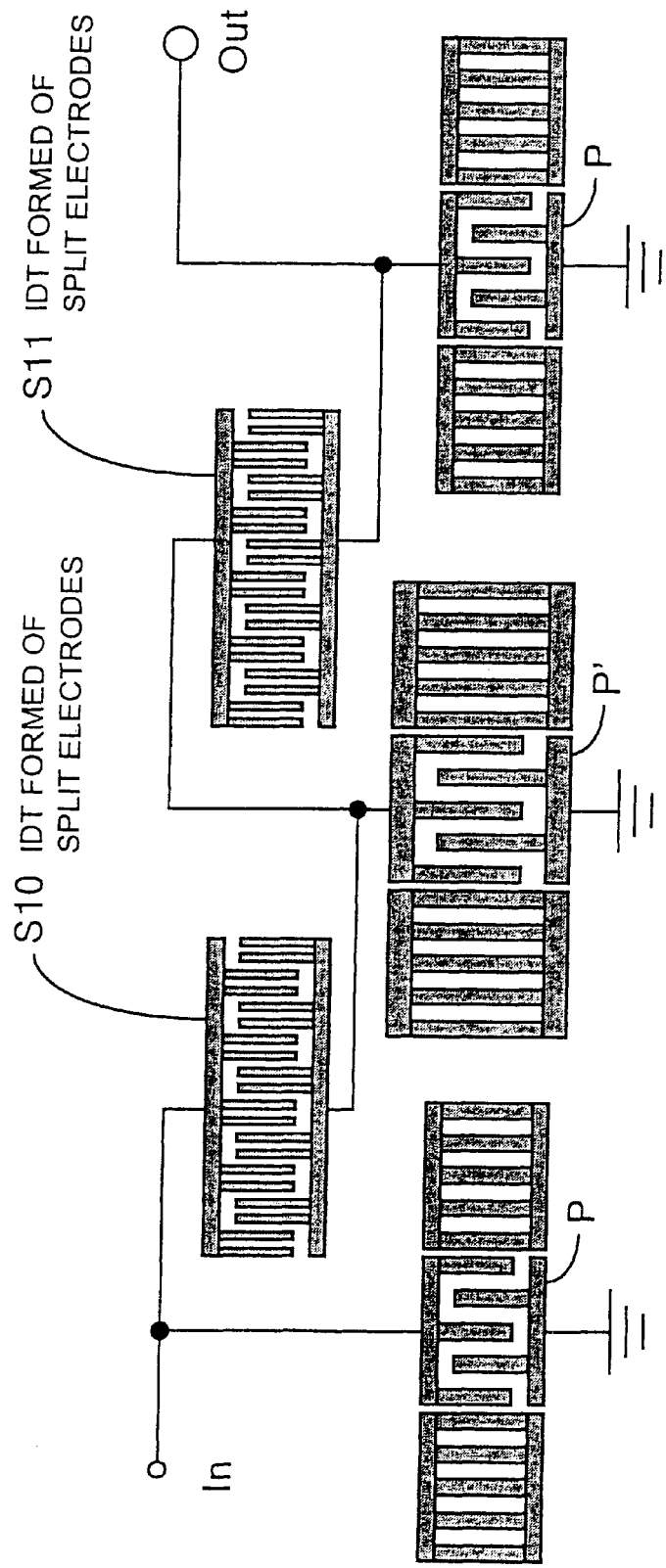
FIG. 9 illustrates the construction of a ladder-form SAW filter in accordance with Example 1 of the present invention.

A ladder-form filter having IDTs composed of split electrodes on series arms was produced on a substrate of 42° Y-X:LiTaO$_3$. Its construction is shown in FIG. 9.

This filter had a four-stage structure. In parallel arms, 2 types of SAW resonators P and P' were used, and in all the series arms, IDTs (S10, S11) composed of split electrodes were connected.

FIG. 11 shows design parameters of the SAW resonators P and P' and the IDTs formed of split electrodes. For comparison, was produced a ladder-form filter having, as resonators connected in series, ordinary SAW resonators each composed of an IDT formed of a single electrode and reflectors. FIG. 12 shows the design parameters of the resonators connected in series.

Figure 10:
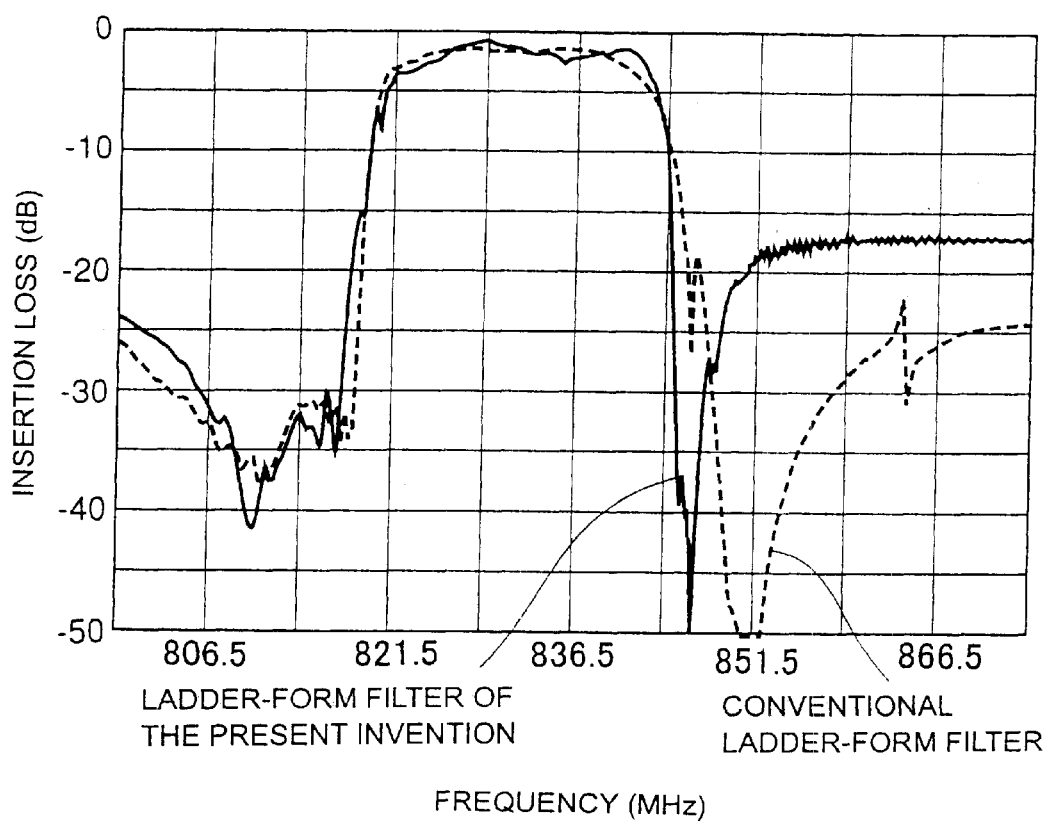
FIG. 10 is a comparative graphical representation of the frequency characteristics of the ladder-form SAW filter in accordance with Example 1 of the present invention.

FIG. 10 shows the frequency characteristics of these two ladder-form SAW filters. It is confirmed that the use of the IDTs composed of split electrodes in the series arms sharpens a transition region on the high frequency side. The shape factor defined by −3 dB and −20 dB was 1.55 in the case where the SAW resonators were used in all the series and parallel arms, while it was improved to 1.47 and the shape factor was improved by using the split electrodes in series arms.

In the ladder-form SAW filter of the present invention, since reflectors are not used on both sides of the split electrodes, the area which has been occupied by the reflectors in the conventional filter is unnecessary, and consequently, the size of a filter chip can be reduced. In this example, the occupied area can be reduced by about 11% as compared with the SAW filter constructed only of SAW resonators.

EXAMPLE 2

Figure 13:
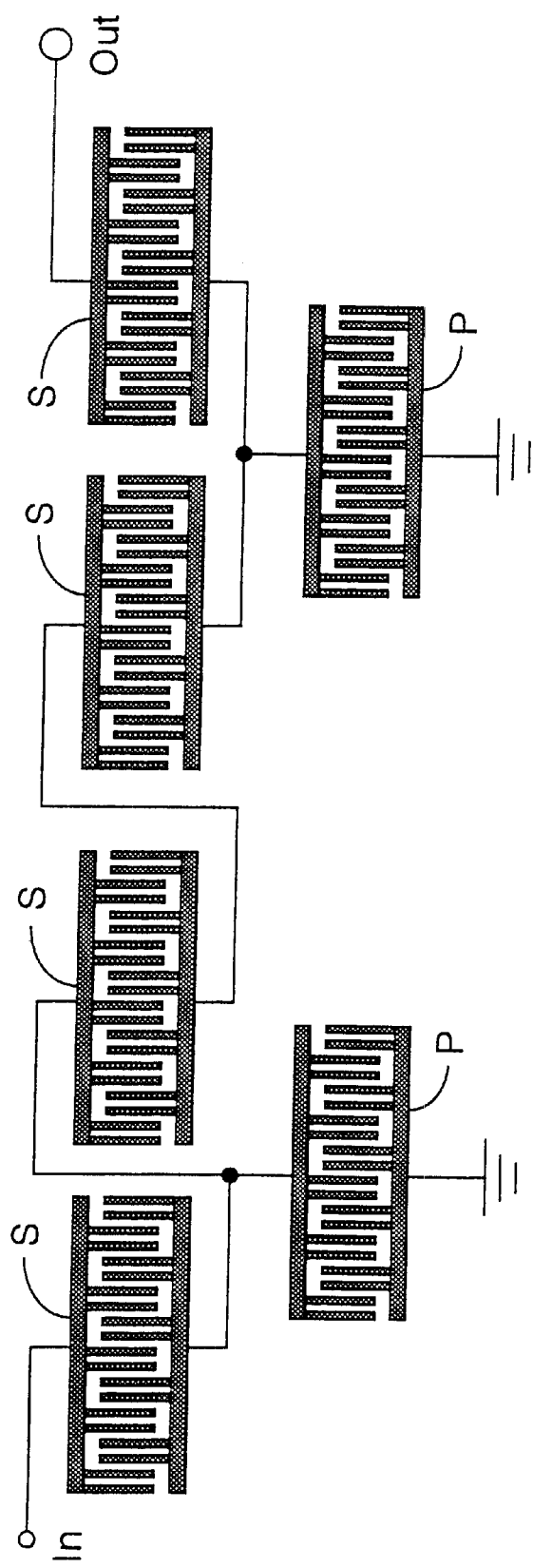
FIG. 13 illustrates the construction of a ladder-form SAW filter in accordance with Example 2 of the present invention.

A ladder-form filter having IDTs composed of split electrodes in series and parallel arms was produced on a substrate of 42° Y-X:LiTaO$_3$. FIG. 13 shows the construction of this SAW filter. Its construction is of four stage in FIG. 13, the split electrodes S and P were used in all series and parallel arms. FIG. 15 shows design parameter of IDT (S and P) composed of the split electrodes.

For comparison, was produced a ladder-form filter having, in both the series and parallel arms, ordinary SAW resonators each composed of an IDT formed of a single electrode and reflectors. Here, the design parameters of the resonators connected in series and parallel are shown in FIG. 16.

Figure 14:
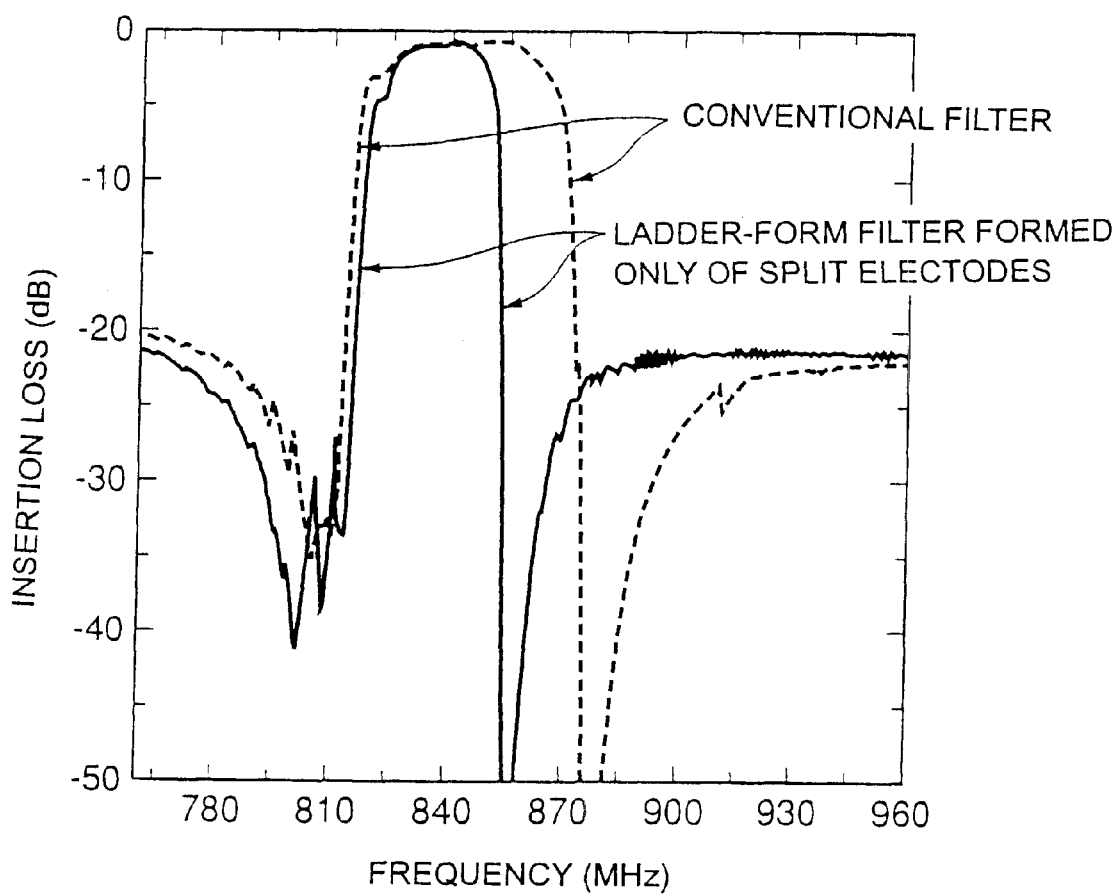
FIG. 14 is a comparative graphical representation of the frequency characteristics of the ladder-form SAW filter in accordance with Example 2 of the present invention.

FIG. 14 shows the frequency characteristics of these two ladder-form SAW filters. It is confirmed that the use of the IDTs composed of split electrodes in the series and parallel arms sharpened the transition region of the SAW filter.

According to the present invention, at least one of the SAW resonators constituting the ladder-form SAW filter is replaced with the IDT not involving the resonance in the SAW propagation direction, and thereby the shape factor of the ladder-form SAW filter can be improved.

In particular, the IDT formed of split electrodes is used as the IDT not involving the resonance and this IDT is used in a series arm of the ladder-form SAW filter. Thereby the sharpness on the high frequency side improves, and filters with an excellent shape factor can be provided.

Further, in the present invention, the area which has been occupied by reflectors in the conventional filter is not necessary, and therefore, the size of the filter can be reduced. Also the period of the IDT formed of split electrodes can be increased as compared with the IDT of the conventional SAW resonator, and therefore, the productivity can be improved in regard to costs and yield.

What is claimed is:

1. A surface acoustic wave filter consisting of series arms and parallel arms connected in a ladder form on a piezoelectric substrate, wherein each of the series arms and parallel arms is composed of either a surface acoustic wave resonator comprising an inter digital transducer (IDT) and reflectors disposed on both sides of the IDT, or only an IDT that does not involve resonance in a propagation direction of a surface acoustic wave, and the series arms and parallel arms include a least one or more arms comprising only the IDT that does not involve resonance.

2. A surface acoustic wave filter according to claim 1, wherein the interdigital transducer that does not involve the resonance is formed of split electrodes.

3. A surface acoustic wave filter according to claim 2, wherein the interdigital transducer that does not involve the resonance is disposed at least either in one or more of the series arms and the parallel arms.

4. A surface acoustic wave filter according to claim 2 or 3, wherein the split electrodes are comb-form electrodes including pairs of two adjacent electrode fingers which are alternately arranged in a direction parallel to the propagation direction of the surface acoustic wave.

5. A surface acoustic wave filter consisting of:

a piezoelectric substrate; and a plurality of surface acoustic wave resonators and at least one interdigital transducer that does not involve resonance, the surface acoustic wave resonators and the interdigital transducer being formed on the piezoelectric substrate and connected in a ladder form, wherein the surface acoustic wave resonators are each composed of an interdigital transducer and reflectors disposed on both sides of the interdigital transducer in a direction parallel to a propagation direction of a surface acoustic wave, and the at least one interdigital transducer that does not involve the resonance is formed of split electrodes.

6. A surface acoustic wave filter according to claim 5, wherein the split electrodes are comb-form electrodes including pairs of two adjacent electrode fingers which are alternately arranged in a direction parallel to the propagation direction of the surface acoustic wave.

* * * * *